(12) United States Patent
Roehr

(10) Patent No.: US 7,495,945 B2
(45) Date of Patent: Feb. 24, 2009

(54) NON-VOLATILE MEMORY CELL FOR STORAGE OF A DATA ITEM IN AN INTEGRATED CIRCUIT

(75) Inventor: Thomas Roehr, Aschheim (DE)

(73) Assignee: Infineon Technologies AG, Munich (DE)

( * ) Notice: Subject to any disclaimer, the term of this patent is extended or adjusted under 35 U.S.C. 154(b) by 443 days.

(21) Appl. No.: 11/332,768

(22) Filed: Jan. 13, 2006

(65) Prior Publication Data

US 2006/0181916 A1    Aug. 17, 2006

(30) Foreign Application Priority Data

Jan. 13, 2005    (DE) ................... 10 2005 001 667

(51) Int. Cl.
*G11C 7/00* (2006.01)
(52) U.S. Cl. .................................... 365/148; 365/189.09
(58) Field of Classification Search ................ 365/148, 365/189.09
See application file for complete search history.

(56) References Cited

U.S. PATENT DOCUMENTS

| | | | |
|---|---|---|---|
| 6,674,679 B1 * | 1/2004 | Perner et al. ................ 365/209 |
| 6,728,148 B2 | 4/2004 | Yamauchi |
| 6,937,509 B2 * | 8/2005 | Perner et al. ................ 365/171 |
| 6,958,931 B1 * | 10/2005 | Yoon et al. .................. 365/159 |
| 2004/0001351 A1 * | 1/2004 | Subramanian et al. ....... 365/158 |
| 2004/0071013 A1 * | 4/2004 | Yoon et al. .................. 365/174 |
| 2004/0257113 A1 | 12/2004 | Toyoda et al. |
| 2005/0122767 A1 * | 6/2005 | Perner et al. ................ 365/158 |
| 2006/0050582 A1 * | 3/2006 | Perner ........................ 365/205 |

* cited by examiner

*Primary Examiner*—Michael T Tran
(74) *Attorney, Agent, or Firm*—Dicke, Billig, Czaja PLLC

(57) ABSTRACT

The present invention relates to a non-volatile memory cell for storage of a data item in an integrated circuit, comprising a resistive memory element which may have different conductance states depending on the stored data item, a memory unit for passing the stored data item to an integrated circuit, a read unit which can be activated in order to pass a data item on for storage in the memory unit as a function of the conductance state of the memory element, a control unit in order to activate the read unit so that the data item to be passed on is stored in the memory unit, and in order to deactivate the read unit after storage of the data item in the memory unit, such that the memory element is isolated from the memory unit.

18 Claims, 4 Drawing Sheets

NON-VOLATILE MEMORY CELL FOR STORAGE OF A DATA ITEM IN AN INTEGRATED CIRCUIT

CROSS-REFERENCE TO RELATED APPLICATIONS

This application claims foreign priority benefits under 35 U.S.C. §119 to co-pending German patent application number DE 10 2005 001 667.7, filed 13 Jan. 2005. This related patent application is herein incorporated by reference in its entirety.

BACKGROUND OF THE INVENTION

1. Field of the Invention

The invention relates to a non-volatile memory cell for storage of a data item in an integrated circuit, in particular to the non-volatile storage of repair information, calibration information and the like in an integrated circuit.

2. Description of the Related Art

A small number of non-volatile memory cells are often required in integrated semiconductor components in order, for example, to permanently store repair data, calibration data, configuration data and the like. Furthermore, it may also be necessary to temporarily store changed variables so that they are also available after the semiconductor component has been switched off and switched on again.

In the case of semiconductor memories, address information for the repair of defective memory cells is normally stored in so-called fuse elements. Fuse elements such as these are typically in the form of so-called laser fuses which represent conductive links which can be disconnected irreversibly by a laser beam. Further applications are, for example, the definition of specific permanent operating modes or the assignment of an identification number for an integrated circuit. However, it may be necessary to change the content of the memory cells during operation of the module, which is not possible when using laser fuses.

At the moment, laser fuses are generally used for storing data which cannot be changed, and these laser fuses can be disconnected with the aid of a focused laser beam. Furthermore, electrically programmable fuses are also known, in which a conductor track is destroyed by a high current flow, or anti-fuses, in which an insulating oxide layer is destroyed by the application of a programming voltage, and is thus made conductive. The laser fuses can be disconnected only in the state in which the integrated modules have not been sawn up before installation in a housing, while the electrical fuses can also be programmed once the component has already been installed in the housing. However, the information is written irreversibly in both cases.

In addition, so-called flash cells are known by means of which data which may vary can be stored such that it is also available after the integrated circuit has been switched off and switched on again. In this case, the information is stored in the form of charge carriers on an isolated electrode. The charge carriers can tunnel non-destructively through a dielectric material towards the electrode and away from the electrode, so that the flash memory cell can be switched between two states. However, relatively high programming voltages are required for the process of programming the flash cell, and must generally be produced with the aid of charge pumps in the integrated circuit. The charge pumps require a large area on the integrated circuit, which represents a considerable additional area requirement, particularly when only a small number of non-volatile memory cells are required.

SUMMARY OF THE INVENTION

One object of the invention is to provide a non-volatile memory cell for an integrated circuit, which can be programmed with little effort and which can be written to once again when required. A further object of the present invention is to provide a non-volatile memory cell which draws little current.

According to the invention, a non-volatile memory cell is provided for storage of a data item in an integrated circuit. The non-volatile memory cell has a resistive memory element which may have different conductance states depending on the data item being stored. Furthermore, a memory unit is provided, in order to pass the stored data item to an integrated circuit. The non-volatile memory cell also has a read unit, which can be activated in order to pass a data item on for storage in the memory unit as a function of the conductance state of the memory element. The read unit is activated with the aid of a control unit, so that the data item to be passed on is stored in the memory unit. The control unit is also configured to deactivate the read unit after storage of the data item in the memory unit, such that the memory element is isolated from the memory unit.

The non-volatile memory cell according to the invention has the advantage that the use of a resistive memory element means that it can permanently store data independently of the application of a voltage supply, with the data item being represented by different conductance states of the resistive memory element. Since a data item which has been stored in the memory cell must generally be provided throughout the entire operating time of the integrated circuit, a memory unit is provided in which the data item which corresponds to the state of the resistive memory element can be stored. This is achieved with the aid of a read unit which is controlled by a control unit, reads the data item from the resistive memory element, for example at the start of operation of the integrated circuit, stores it in the memory unit, and then disconnects the resistive memory element from the memory unit. This makes it possible to avoid the need for an operating current to flow continuously through the resistive memory element in order to detect its conductance state, that is to say, the data item stored in it. An operating current such as this would result in the power consumption of the overall integrated circuit being increased, and this is avoided by the invention.

Power is preferably removed from the memory element after deactivation of the read unit. This makes it possible to reduce the current drawn by the integrated circuit, since no read current flows through the resistive memory element when the read unit is deactivated.

The resistive memory element may preferably have a PMC component (also referred to as a CB-RAM component), and/or a phase changing component.

The read unit preferably has a selection transistor, which is stored in series with the resistive memory element. This represents a particularly simple way to provide the read unit.

The memory unit is preferably formed with two inverters, each of whose inputs is connected to the output of the respective other inverter. A first of the inverters emits the stored data item at its output, and a second of the inverters emits a data item which has been inverted with respect to the stored data item at its output, with the memory unit being written to by the data item to be stored being produced at the output of the first inverter, such that the memory unit stores the data item that is produced.

The read unit can be designed such that a logic level which is governed by the conductance state of the memory element is produced at the output of the first inverter when the read unit is activated, in order to write to the memory unit. The read unit can also be designed such that the memory unit is written to by producing a data item which has been inverted with respect to the stored data item at the output of the second inverter.

According to one preferred embodiment of the invention, the memory element can be connected to a programming unit in order to set a desired conductance state, so that a desired data item is stored.

Furthermore, a write unit can be provided in order to write a data item to the memory unit when the read unit is deactivated.

In particular, the programming unit can be designed in order to set a conductance state, which corresponds to the data item stored in the memory unit, in the memory element as a function of a control signal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
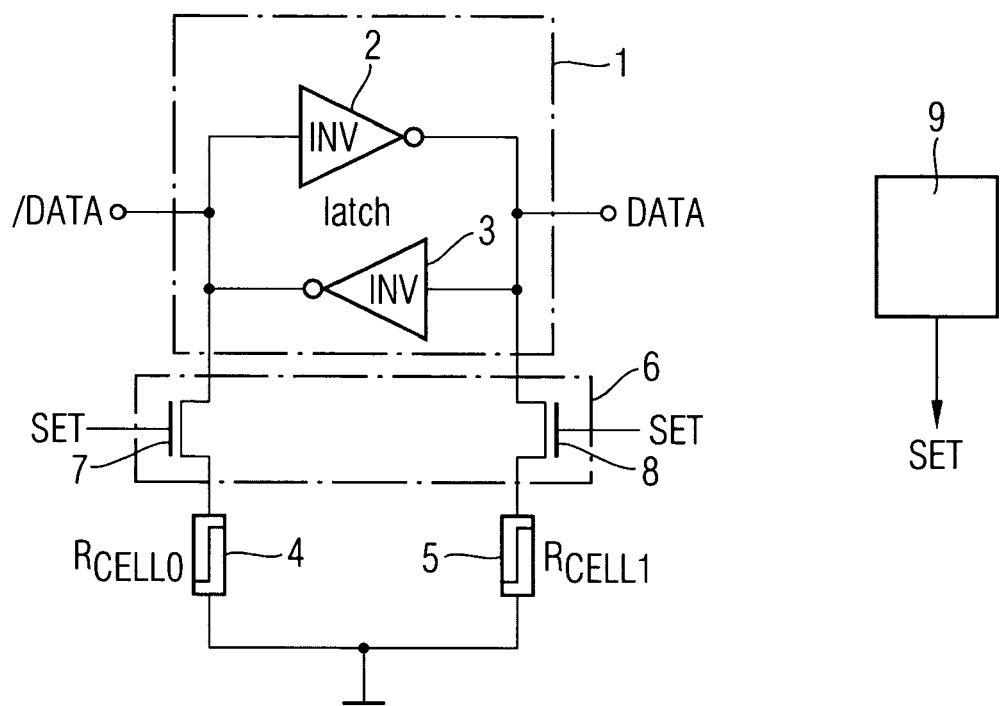
FIG. 1 shows a circuit diagram of a non-volatile memory cell according to a first embodiment of the invention.

FIG. 1 shows a circuit diagram of a non-volatile memory cell for storage of a data item in an integrated circuit, according to a first embodiment. The non-volatile memory cell has a memory unit 1 which has a first inverter 2 and a second inverter 3. The first inverter 2 and the second inverter 3 are connected with negative feedback, that is to say, one input of one of the inverters is in each case connected to one output of the respective other inverter. The outputs of the two inverters 2, 3 represent the data outputs DATA, /DATA of the memory unit 1. The inverters 2, 3 with negative feedback form a latch, which makes a stored data item available to a circuit (not illustrated) in the integrated circuit.

In this exemplary embodiment, two resistive memory elements are provided for non-volatile storage of a data item, with a first resistive memory element 4 being coupled via a read unit 6 to the input of the first inverter 2, and a second resistive memory element 5 being coupled via the read unit 6 to the input of the second inverter 3. The read unit 6 has a first switching transistor 7 in order to couple the first memory element 4 to the input of the first inverter 2, and a second switching transistor 8 in order to couple the second memory element 5 to the input of the second inverter 3. The two switching transistors 7, 8 are activated and deactivated via a control signal SET, which is produced by a control unit 9. The control unit is used to send the stored data item to the integrated circuit by writing the content of the data item to be stored as a conductance state in the memory elements to the memory unit 1.

The resistive memory elements 4, 5 are preferably in the form of PMC components (also referred to as CB-RAM components) and/or phase changing components. The resistive memory elements 4, 5 have the characteristic that their conductance state can be varied, and that this conductance state can be set by application of an electrical variable for programming.

The resistive memory elements 4, 5 are preferably provided with mutually complementary conductance states during storage of a data item. For example, the conductance state of the first memory element 4 is set to be high, and the conductance state of the second memory element is set to be low, in order, for example, to store a logic "0", and correspondingly reversed in order to store a logic "1".

The memory unit 1 is written to by activating the switching transistors 7, 8 (closing them) so that the output of the first inverter 2 is connected via the switched-on second switching transistor 8 and via the second memory element 5 to a ground potential, or to a potential which corresponds to a "logic 0". The output of the second inverter 3 is then connected via the first switching transistor 7 and via the first memory element 4 to the ground potential GND, once again.

Figure 2A:
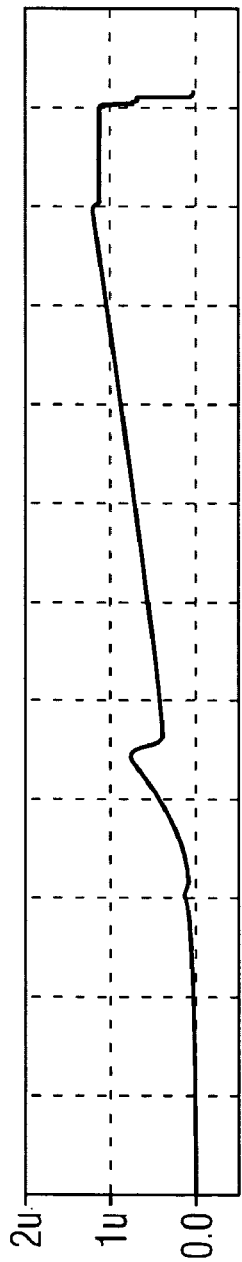
FIGS. 2A to 2D show signal timing diagrams which illustrate the operation of the read unit.
Figure 2B:
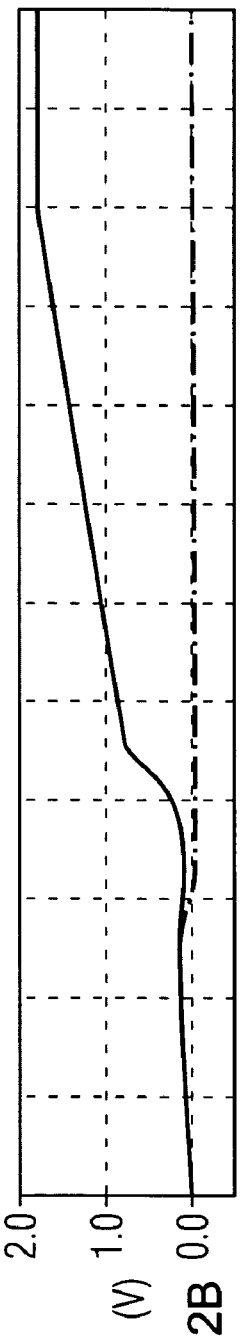
Figure 2C:
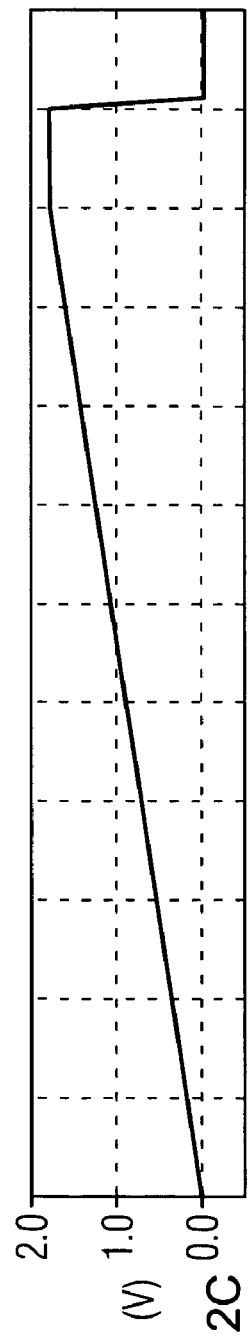
Figure 2D:
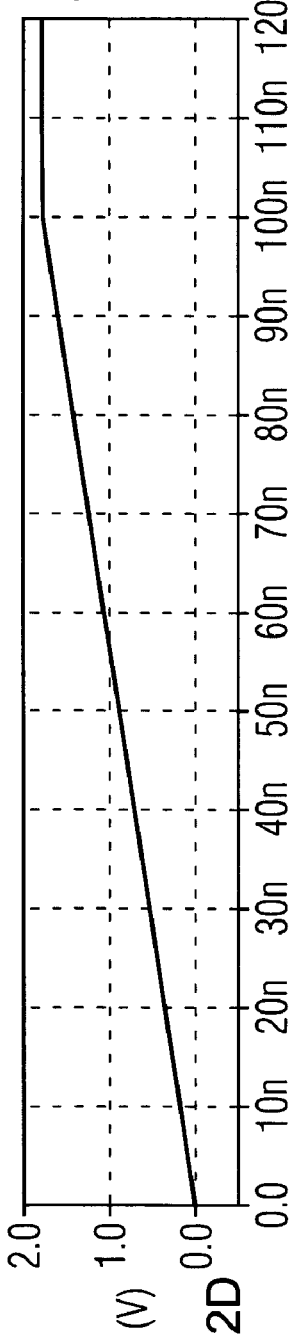

Once the supply voltage has been connected to the integrated circuit which has the non-volatile memory cell as shown in FIG. 1, the memory unit is in an undefined state, that is to say, either a logic "0" or a logic "1" is stored. The control unit 9 now activates the read unit 6, so that the switching transistors 7, 8 are switched on, and the outputs of the inverters are connected to the ground potential via the respective memory element 4, 5. The memory element with the lower resistance value (one of memory element 4, 5) now draws the corresponding output of the memory unit to a greater extent in the direction of the ground potential GND than the memory element with the higher resistance value (the other one of memory element 4, 5). This results in a switching behavior as is illustrated in the signal timing diagrams in FIG. 2. In this case, FIG. 2A shows the current profile of the supply current for the non-volatile memory cell, FIG. 2B shows the signal profiles of the outputs of the memory unit; FIG. 2C shows the signal profile of the control signal SET, and FIG. 2D shows the voltage profile when the integrated circuit is switched on.

The illustrated signal profiles describe a situation in which the memory unit 1 is programmed immediately after the integrated circuit is switched on, that is to say, on application of the supply voltage, corresponding to the conductance states of the memory elements 4, 5. The supply voltage $V_{int}$ is raised from 0 volts to the final value (in this case 1.8 volts) during the switching-on phase. In the illustrated example, the first resistive memory element 4 has a low resistance value $R_{cell0}$ (for example 10 kΩ), and the second memory element 5 has the high resistance value $R_{cell1}$ (for example 1 MΩ). When the supply voltage $V_{int}$ reaches a specific voltage value, the latch trips to the predetermined state, in this case DATA=1 and /DATA=0. The supply current increases as the supply voltage increases. The current is a result of the resistance value of the second memory element and of the voltage at the output of the first inverter 2. The supply current is reduced essentially to 0 by the deactivation of the read unit 6 by the control unit 9, since the memory unit 1 essentially requires no current in order to store the data item.

Figure 3A:
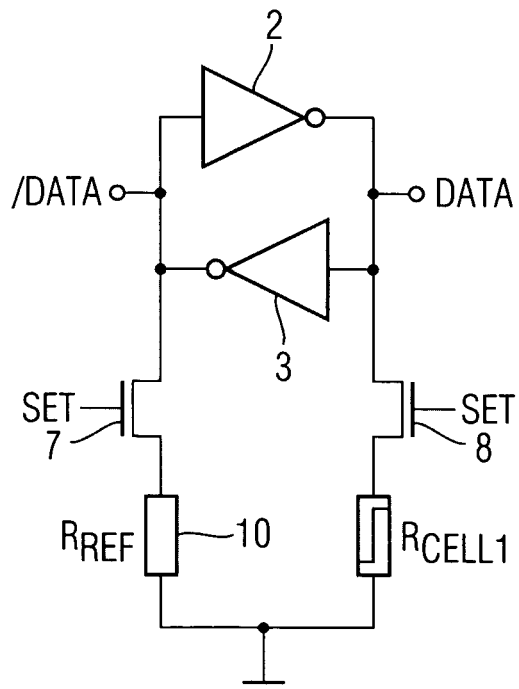
FIGS. 3A and 3B show block diagrams of further exemplary embodiments of non-volatile memory cells.
Figure 3B:
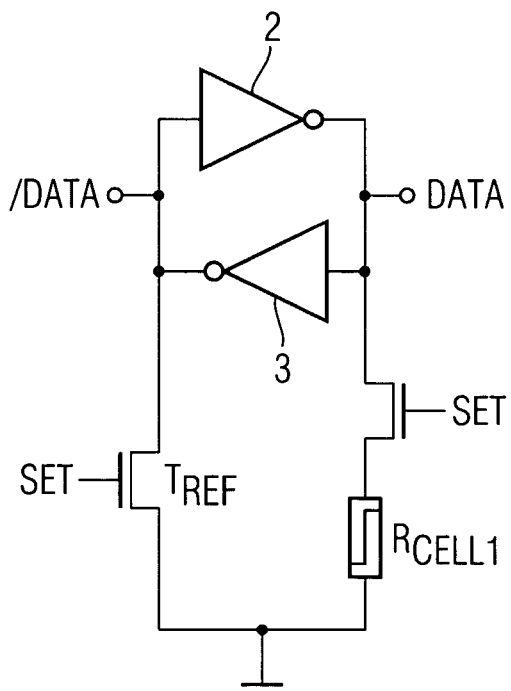

FIGS. 3A and 3B show further exemplary embodiments of a non-volatile memory cell according to the invention. The two illustrated exemplary embodiments differ from the embodiment shown in FIG. 1 in that only one resistive memory element is required for storage of the data item. The embodiment shown in FIG. 3A differs from the embodiment shown in FIG. 1 in that a reference resistance element 10 is provided instead of the first resistive memory element 4 and has a defined resistance value $R_{ref}$. The defined resistance value $R_{ref}$ corresponds essentially to a resistance value which is between the resistance value of the conductance states of the second resistive memory element. Depending on whether the resistance value $R_{cell1}$ of the state of the second resistive memory element 5 is higher or lower than the resistance value $R_{ref}$ of the reference resistance element 10, the memory unit 1 correspondingly has a logic "0" or a logic "1" written to it when the read unit 6 is activated.

The embodiment shown in FIG. 3B simplifies the embodiment shown in FIG. 3A in that the reference resistance element 10 is integrated in the channel resistance of the first switching transistor 6. This means that the first switching transistor 6 is designed such that the forward resistance value in the activated state corresponds to the resistance value of the reference resistance component 10 in FIG. 3A.

Figure 4:
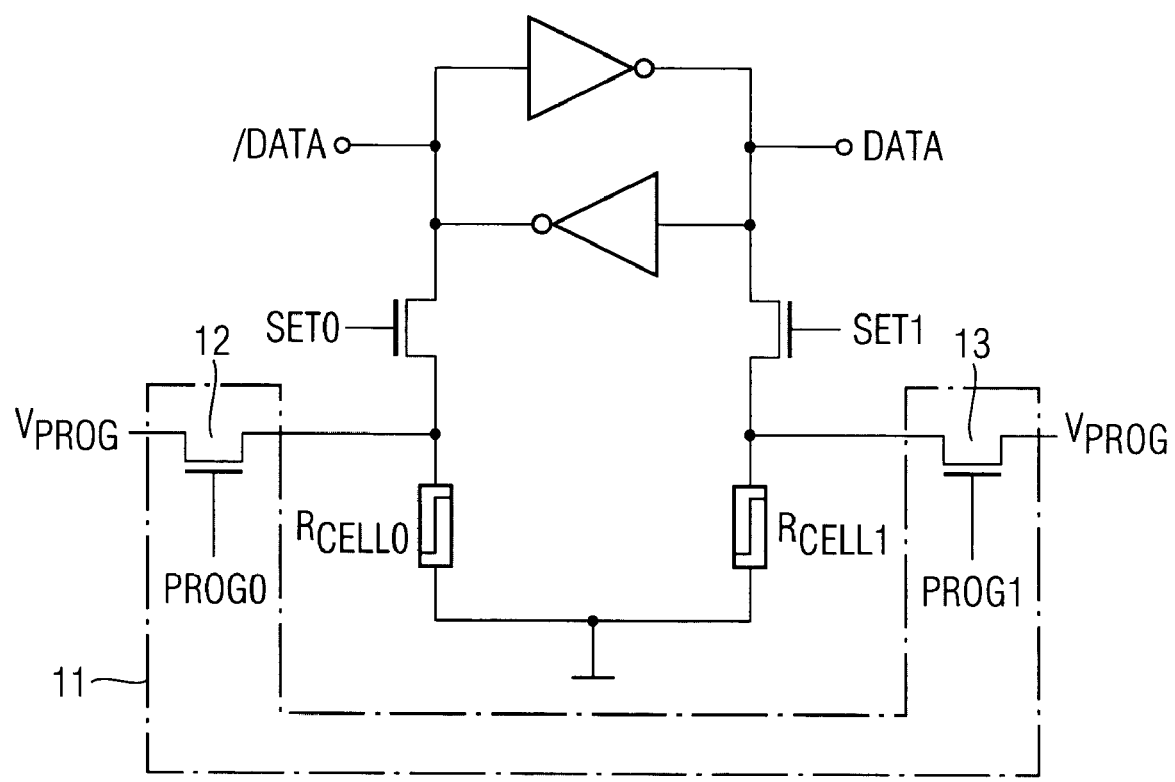
FIG. 4 shows a non-volatile memory cell according to a further embodiment of the invention with a programming unit for writing to the resistive memory element.

FIG. 4 illustrates a further embodiment of the invention. FIG. 4 represents a development of the embodiment shown in FIG. 1. In addition to the elements in the embodiment shown in FIG. 1, a programming unit 11 is provided, which has a first programming transistor 12 and a second programming transistor 13. The programming unit 11 is provided in order to program the resistive memory elements 4, 5 in a suitable manner, which is normally done by the application of a suitable programming voltage $V_{PROG}$. The memory elements 4, 5 are programmed on the basis of programming control signals PROG0, PROG1, which can be produced by the control unit 9. In a further embodiment, the function of the programming transistors 12, 13 can also be carried out by the switching transistors 7, 8, in which case the appropriate programming voltage must be produced at the outputs of the memory unit 1 for this purpose.

Figure 5:
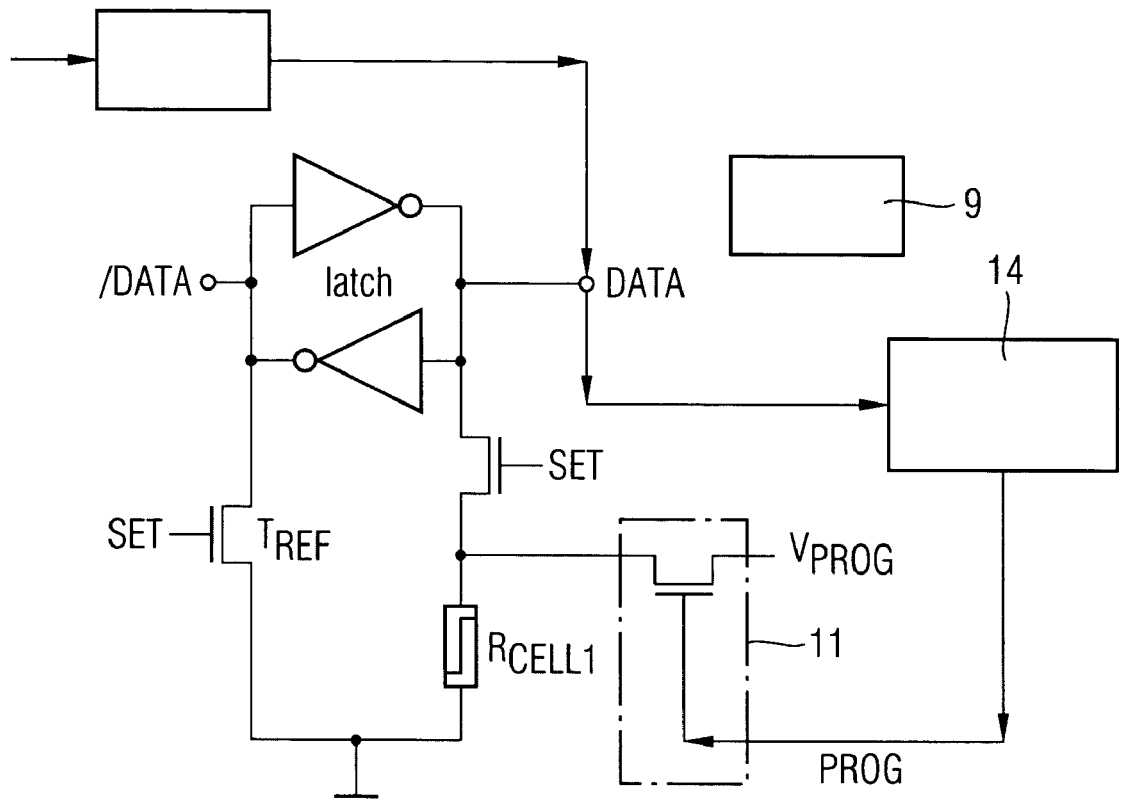
FIG. 5 shows a non-volatile memory cell according to a further embodiment of the invention, with a programming unit and a write unit.

When variables which can change are being stored (for example, a count), the state of the memory unit, that is to say, the stored data item, may change during the operation of the integrated circuit, by the circuit in the integrated circuit writing a different data item to it. FIG. 5 shows an embodiment which allows a changed state of the memory unit 1 to be stored permanently (i.e., non-volatile), so that it is still available after the supply voltage has been switched off and switched on again. A write unit 14 is provided for this purpose which, controlled by the control unit 9, reads the data item from the memory unit 1 shortly before the operating voltage is switched off, and generates the programming control instructions Prog1, Prog2 for the programming unit 11, preferably when the read unit 6 is deactivated, such that the conductance states of the resistive memory elements 4, 5 are set such that they lead to the storage of the previously read data item in the memory unit 1 when reading via the read unit 6. Since the conductance states are stored in the resistive memory elements 4, 5 without the operating voltage being applied, a non-volatile memory cell can thus be provided which on the one hand can be operated in the form of a conventional register memory in the integrated circuit, and on the other hand permanently stores the stored state since, for example, this is stored shortly before the operating voltage to the resistive memory elements is switched off. The programming unit 11, the write unit 14 and the read unit 6 are controlled by the control unit 9. Once the operating voltage has been connected to the integrated circuit, the control unit 9 can immediately read the resistive memory element or elements 4, 5 as described above in conjunction with FIG. 2, and can store the corresponding state in the memory unit 1. In the case of the embodiment in FIG. 5, the state which is currently stored in the memory unit 1 can be stored in the resistive memory element 5 at regular time intervals or at defined times, in order to reliably store the data item which is stored in the memory unit 1.

While the foregoing is directed to embodiments of the present invention, other and further embodiments of the invention may be devised without departing from the basic scope thereof, and the scope thereof is determined by the claims that follow.

What is claimed is:

1. A memory cell for storage of a data item in an integrated circuit, comprising:
a resistive memory element having different conductance states depending on the stored data item;
a memory unit for passing the stored data item to the integrated circuit;
a read unit configured to pass the data item on for storage in the memory unit, wherein the data item is determined as a function of the conductance state of the memory element;
a control unit configured to selectively activate the read unit, whereby the memory element is connected to the memory unit, and deactivate the read unit after storage of the data item in the memory unit, whereby the memory element is isolated from the memory unit, and wherein the memory unit comprises a first inverter and a second inverter having respective inputs connected to respective outputs of each other, wherein the first inverters emits the stored data item at its output and the second inverter emits an inverted data item which has been inverted with respect to the stored data item at its output, and wherein the memory unit stores the data item produced at the output of the first inverter.

2. The memory cell of claim 1, wherein the control unit is configured to remove power from the memory element on deactivation of the read unit.

3. The memory cell of claim 1, wherein the memory element comprises one of a programmable metallization cell (PMC) component and a phase changing component.

4. The memory cell of claim 1, wherein the read unit comprises a selection transistor which is connected in series with the resistive memory element.

5. The memory cell of claim 1, wherein the read unit produces a logic level corresponding to the conductance state of the memory element at the output of the first inverter when the read unit is activated, and wherein the data item written to the memory unit corresponds to the logic level.

6. The memory cell of claim 1, wherein the read unit is configured to write the inverse data item produced at the output of the second inverter to the memory unit.

7. A memory cell for storage of a data item in an integrated circuit, comprising:
a resistive memory element having different conductance states depending on the stored data item, wherein the memory element is connected to a programming unit for setting a desired conductance state of the memory element corresponding to a desired data item;
a memory unit for passing the stored data item to the integrated circuit;
a read unit configured to pass the data item on for storage in the memory unit, wherein the data item is determined as a function of the conductance state of the memory element;

a control unit configured to selectively activate the read unit, whereby the memory element is connected to the memory unit, and deactivate the read unit after storage of the data item in the memory unit, whereby the memory element is isolated from the memory unit; and a write unit for writing the desired data item to the memory unit when the read unit is deactivated.

8. The memory cell of claim 7, wherein the programming unit is configured to set a respective conductance state, which corresponds to the data item stored in the memory unit, in the memory element as a function of a control signal.

9. A non-volatile memory cell for storage of a data item in an integrated circuit, comprising:

a first resistive memory element having a first conductance state;

a second resistive memory element having a second conductance state, wherein the second conductance state is the compliment of the first conductance state of the first resistive memory element;

a read unit connected to the first and second resistive memory elements for reading the stored data item as a function of the first and second conductance states of the first and second resistive memory elements; and a memory unit connected to received the stored data item read-out by the read unit and for passing the stored data item to the integrated circuit, wherein the read unit is selectively activated to read the stored data item from the first resistive memory element and pass the stored data item to the memory unit and deactivated thereafter whereby the memory element is isolated from the memory unit.

10. The memory cell of claim 9, further comprising:

a control unit configured to selectively activate and deactivate the read unit.

11. The memory cell of claim 9, wherein the first and second Resistive elements each comprise a programmable metallization cell (PMC) component.

12. The method of claim 9, wherein the second resistive memory element comprises a reference resistance element having a reference resistance set between a high conductance state and a low conductance state of the first resistive memory element.

13. The memory cell of claim 9, wherein the read unit comprises a first switching transistor and a second switching transistor respectively connected to the first and second resistive memory elements, and wherein the second resistive memory element comprises a reference resistance element which is incorporated into the second switching transistor.

14. An integrated circuit having a non-volatile memory cell for storage of a data item, comprising:

a first resistive memory element having a first conductance state corresponding to the stored data item;

a second resistive memory element having a second conductance state;

a read unit comprising a first switching transistor and a second switching transistor respectively connected to the first and second resistive memory elements for reading the stored data item as a function of the first and second conductance states of the first and second memory elements;

a memory unit comprising a first inverter and a second inverter having respective inputs and outputs connected to each other, wherein an output of the first inverter is connected via the first switching transistor to the first resistive memory element and wherein an output of the second inverter is connected via the second switching transistor to the second resistive memory element; and a control unit configured to selectively activate the first and second switching transistors of the read unit to connect first and second resistive memory elements to the memory unit and deactivate the read unit thereafter to disconnect the first and second resistive memory elements from the memory unit.

15. The integrated circuit of claim 14, further comprising:

a programming unit comprising a first programming transistor connected to the first resistive memory element and a second programming transistor connected to the second resistive memory element, wherein the first and second resistive memory elements are programmed to respective desired conductance states by selectively activating the first and second programming transistors.

16. The integrated circuit of claim 14, wherein the second resistive memory element comprises a reference resistance element.

17. The integrated circuit of claim 14, wherein the second resistive memory element comprises a reference resistance element which is incorporated into the second switching transistor.

18. The integrated circuit of claim 17, further comprising:

a programming unit comprising a programming transistor connected to the first resistive memory element, wherein the first resistive memory element is programmed to a desired conductance state by selectively activating the programming transistor; and a write unit connected to selectively activate the programming unit.

* * * * *